(12) United States Patent
Machida et al.

(10) Patent No.: US 7,982,372 B2
(45) Date of Patent: Jul. 19, 2011

(54) PIEZOELECTRIC TRANSFORMER HAVING A RECESS TO SURELY MAINTAIN A POSITION OF AN ELASTIC MEMBER PRESS-FITTED BETWEEN AN ELECTRODE AND A TERMINAL

(75) Inventors: Akio Machida, Saitama (JP); Ryo Nakagawa, Saitama (JP); Yasuhide Matsuo, Saitama (JP)

(73) Assignee: Tamura Corporation, Tokyo (JP)

( * ) Notice: Subject to any disclaimer, the term of this patent is extended or adjusted under 35 U.S.C. 154(b) by 323 days.

(21) Appl. No.: 12/326,353

(22) Filed: Dec. 2, 2008

(65) Prior Publication Data

US 2009/0146535 A1    Jun. 11, 2009

(30) Foreign Application Priority Data

Dec. 5, 2007  (JP) .............................. P2007-315082

(51) Int. Cl.
*H01L 41/04* (2006.01)
*H01L 41/08* (2006.01)
(52) U.S. Cl. ........................ 310/354; 310/355; 310/359

(58) Field of Classification Search .......... 310/354–355, 310/359
See application file for complete search history.

(56) References Cited

U.S. PATENT DOCUMENTS
7,834,523 B2 *  11/2010  Higashionji et al. .......... 310/345

FOREIGN PATENT DOCUMENTS
| JP | 6-342945 | | 12/1994 |
| JP | 2000-124519 | | 4/2000 |
| JP | 2001-267647 | | 9/2001 |
| JP | 2001267647 A | * | 9/2001 |
| JP | 2002344040 A | * | 11/2002 |

* cited by examiner

*Primary Examiner* — J. SanMartin
(74) *Attorney, Agent, or Firm* — Holtz, Holtz, Goodman & Chick, PC (57) ABSTRACT

A piezoelectric transformer includes: a piezoelectric transducer on whose outer surface an electrode is formed; a case housing the piezoelectric transducer; a terminal disposed to face the electrode; an elastic member in contact with both the electrode and the terminal in the case and having conductivity to bring the electrode and the terminal into mutual continuity; and a folder formed in the case and fixedly holding the elastic member to press-fit the elastic member between the electrode and the terminal.

20 Claims, 5 Drawing Sheets

PIEZOELECTRIC TRANSFORMER HAVING A RECESS TO SURELY MAINTAIN A POSITION OF AN ELASTIC MEMBER PRESS-FITTED BETWEEN AN ELECTRODE AND A TERMINAL

BACKGROUND OF THE INVENTION

1. Field of the Invention

The present invention relates to a piezoelectric transformer generating a desired output voltage by using a mechanical oscillation of a piezoelectric transducer.

2. Description of the Related Art

A piezoelectric transformer of this type is used, for instance, as high voltage power supplies of inverters for liquid crystal display back-lighting and the like, and generates a high voltage output from a low voltage input. To be in more detail, this transformer has a piezoelectric transducer housed in its case and the transducer has a function of transducing electric energy into mechanical energy. That is, owing to the mechanical oscillation of the transducer which is caused by the application of an input voltage to the transducer (a resonance phenomenon), a desired transformed output voltage is obtained.

Here, a primary electrode (Input) and a secondary electrode (Output) are formed on an outer surface of the transducer, the primary electrode being connected to an input-side terminal and the secondary electrode being connected to an output-side terminal. A technique using a tinsel wire for connecting the electrodes and the terminals is disclosed in Japanese Patent Application Laid-open No. Hei 6-342945, and techniques using conductive elastic members for connecting the electrodes and the terminals are disclosed in Japanese Patent Application Laid-open No. 2000-124519 and Japanese Patent Application Laid-open No. 2001-267647.

In the aforesaid case where the elastic member is used, there occurs no breakage of the tinsel wire or no peeling of soldered connection portions due to the oscillation of the piezoelectric transducer.

However, the use of the elastic members for connecting the electrodes and the terminals has a problem that the elastic members are easily displaced. This is because the elastic members are only press-fit between the electrodes and the terminals and are not firmly connected by soldering as is done in the aforesaid technique using the tinsel wire.

Moreover, the displacement of the elastic members can occur not only during the operation of the piezoelectric transformer but also during the assembly of the transformer.

This necessitates some measure for solving the displacement, but in the aforesaid conventional techniques, the elastic members are only press-fit between the electrodes and the terminals and this problem is still left unsolved.

Further, to solve this problem, the position where the piezoelectric transducer and the elastic members are in contact with each other needs to be considered. This is because, when the elastic members are to be press-fit, it is difficult to insert it from an opening into the deepest portion of the case. Moreover, the mechanical oscillation of the transducer occurs in a plurality of directions perpendicular to one another, and only with the consideration of the mechanical oscillation in one direction, the displacement of the elastic member still easily occurs.

SUMMARY OF THE INVENTION

It is an object of the present invention to provide a piezoelectric transformer in which the position of an elastic member connected between an electrode and a terminal is surely maintained.

A piezoelectric transformer of the present invention includes a piezoelectric transducer on whose outer surface an electrode is formed, and the piezoelectric transducer is housed in a case. The piezoelectric transformer further includes a terminal disposed to face the electrode of the piezoelectric transducer, and a primary elastic member is disposed between the electrode and the terminal. The elastic member is conductive and is in contact with both the electrode and the terminal to be capable of bringing the electrode and the terminal into mutual continuity.

Here, the piezoelectric transformer has a primary folder. The folder fixedly holds the primary elastic member in the case, that is, holds the elastic member in a restricted state so as to prevent the elastic member from moving in the case, and thus the elastic member can be surely press-fit between the electrode and the terminal. This prevents the easy displacement of the primary elastic member even during the assembly and the operation of the piezoelectric transformer, for instance and thus the position of the elastic member is surely maintained between the electrode and the terminal. This as a result contributes to reliability enhancement of the piezoelectric transformer.

Preferably, the piezoelectric transducer is formed substantially in a rectangular parallelepiped shape having dimensions in a longitudinal direction, a thickness direction, and a width direction thereof. The electrode is formed on at least one of surfaces which make a pair in the thickness direction. The primary folder has a widthwise-position defining surface, the width direction being substantially perpendicular to the longitudinal direction and the thickness direction, and the primary elastic member is disposed on the position defining surface to be positioned between an upper surface side and a bottom surface side of the case.

Therefore, when the piezoelectric transformer is assembled, it is possible to easily press-fit the primary elastic member between the electrode and the terminal while preventing the displacement of the primary elastic member, as contrast to the conventional structure where the elastic member is inserted up to the deepest portion of the case.

Further, preferably, the widthwise-position defining surface is set so as to position the primary elastic member near a node of oscillation in terms of the width direction of the piezoelectric transducer. This is because, with this structure, the elastic member is disposed at a position where the mechanical oscillation of the transducer occurring during the operation of the piezoelectric transformer is small, more specifically, where the oscillation occurring along the width direction of the transducer is small, and thus the elastic member is less likely to receive the influence of the oscillation, which also contributes to the prevention of the displacement of the elastic member.

Further, if the widthwise-position defining surface is set so as to position the primary elastic member at a substantially center position of the electrode in terms of the width direction of the piezoelectric transducer, the elastic member not only can be surely in contact with the electrode but also can support the piezoelectric transducer at such a position as to keep the piezoelectric transducer in the best balanced state, which can also contribute to the prevention of the displacement of the elastic member.

Further preferably, the primary folder has a longitudinal-position defining surface and this position defining surface is set so as to position the primary elastic member near a node of oscillation in terms of a longitudinal direction of the piezoelectric transducer. This is because the elastic member is less likely to receive the influence of the mechanical oscillation occurring along the longitudinal direction of the piezoelectric transducer.

Further, the primary folder has projections projecting toward the elastic member, and by the projections sandwiching the primary elastic member, the elastic member is prevented from coming off the folder and it is possible to more surely maintain the position of the elastic member.

Further preferably, the piezoelectric transformer includes a secondary elastic member and a secondary folder. The secondary elastic member is not conductive, is disposed to face the primary elastic member across the piezoelectric transducer, and is in contact with both the case and the transducer. The secondary folder fixedly holds the secondary elastic member in the case, so that the secondary elastic member can be also surely press-fit between the case and the transducer. In this case, the easy displacement of the secondary elastic member is also prevented.

The secondary folder also has a widthwise-position defining surface, and the secondary elastic member is disposed on the position defining surface to be positioned between the upper surface side and the bottom surface side of the case. This structure can also prevent the displacement of the secondary elastic member and at the same time can facilitate press-fitting the elastic member between the case and the piezoelectric transducer, as contrast to the conventional structure.

Further, if this widthwise-position defining surface is also set so as to position the secondary elastic member at a substantially center position of the transducer in terms of the width direction of the piezoelectric transducer, the elastic member not only can be surely in contact with the piezoelectric transducer but also can support the transducer at such a position as to keep the transducer in the best balanced state, which can also contribute to the prevention of the displacement of the secondary elastic member.

Further preferably, if the secondary folder also has projections projecting toward the secondary elastic member, the elastic member is prevented from coming off the folder since the projections sandwich the elastic member, and it is possible to more surely maintain the position of the secondary elastic member.

BRIEF DESCRIPTION OF THE DRAWINGS

The present invention will become more fully understood from the detailed description given herein below and the accompanying drawings which are given by way of illustration only, and thus, are not limitative of the present invention, and wherein.

DETAILED DESCRIPTION OF THE PREFERRED EMBODIMENTS

Embodiments of the present invention will be hereinafter described with reference to the drawings.

Figure 1:
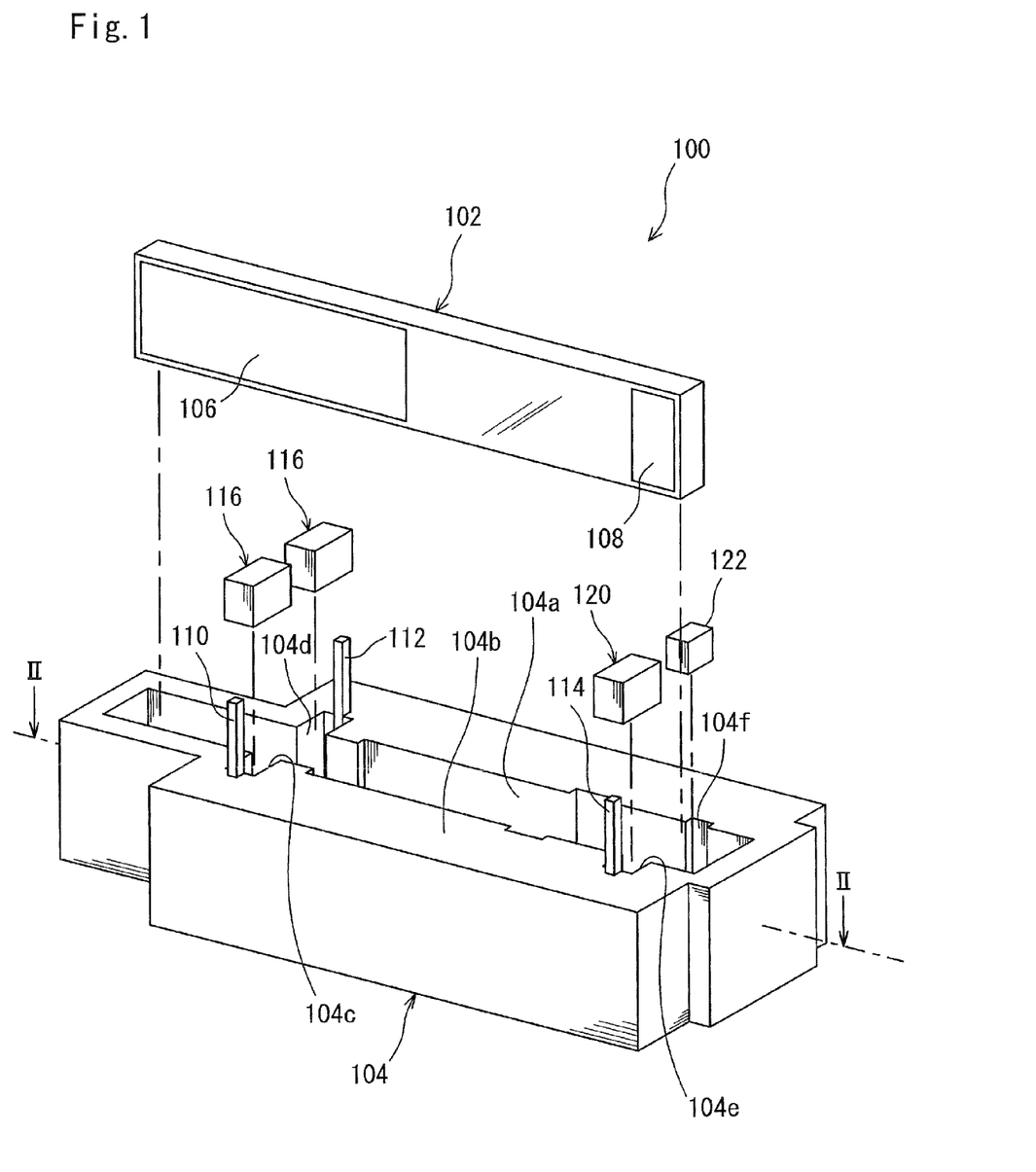
FIG. 1 is an exploded perspective view of a piezoelectric transformer in this embodiment.
Figure 2:
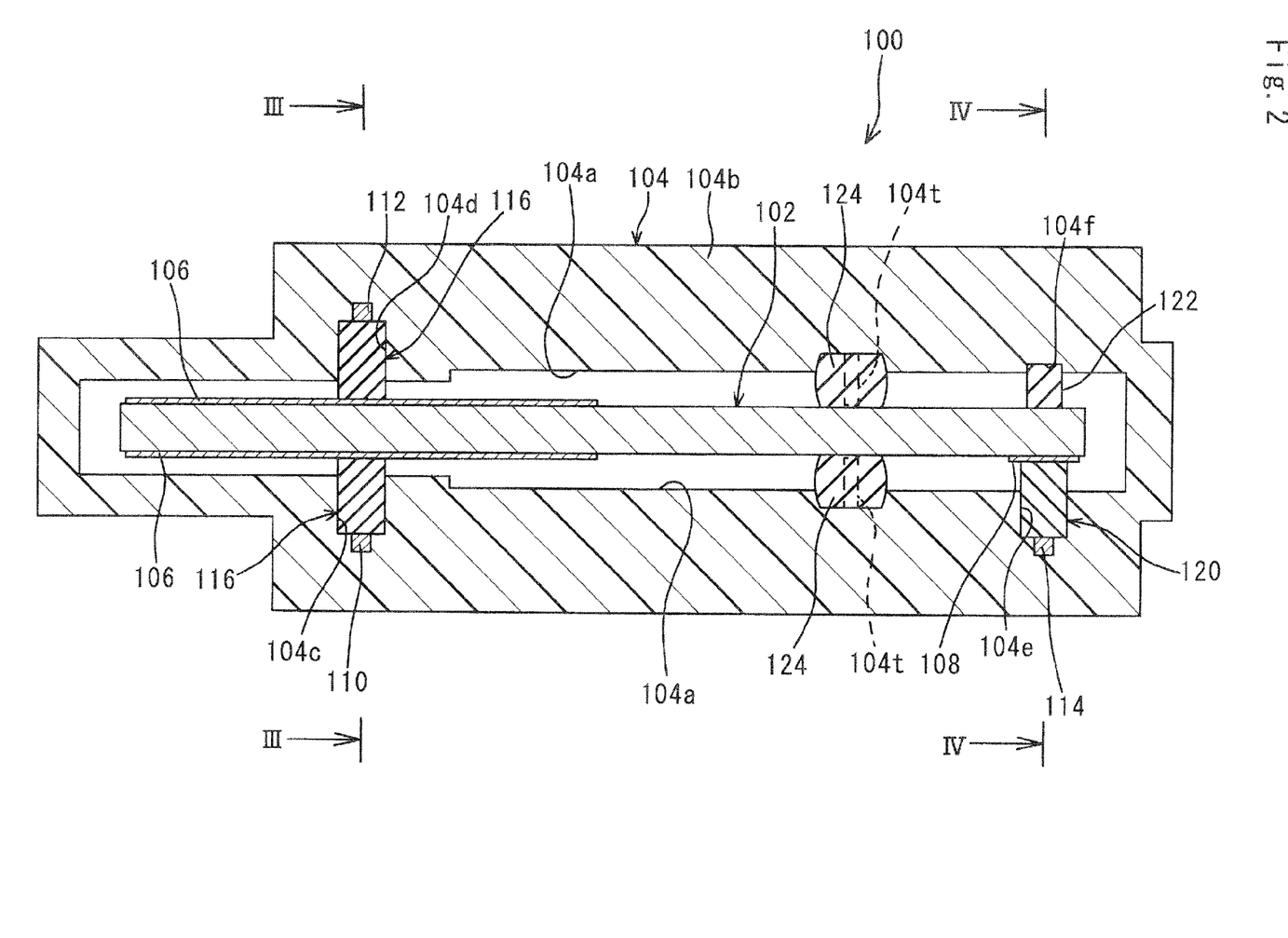
FIG. 2 is a horizontal sectional view showing the piezoelectric transformer in FIG. 1 in its completed state.

FIG. 1 is an exploded perspective view of a piezoelectric transformer 100 in this embodiment, and FIG. 2 is a horizontal sectional view showing the transformer 100 in its completed state (in other words, a sectional view seen in the direction of the arrows II-II in FIG. 1). The transformer 100 is used, for instance, as high voltage power supplies of inverters for liquid crystal display back-lighting and the like, and generates a high voltage output from a low voltage input.

As shown in FIG. 1, the transformer 100 includes a piezoelectric ceramics (piezoelectric transducer) 102 and a resin case (case) 104. The ceramics 102 is housed in the case 104. Note that the upward direction in FIG. 1 corresponds to a bottom surface side of the case 104. This is because the transformer 100 is mounted on a circuit board (not shown) with the bottom surface side of the case 104 facing a mounting surface of the circuit board.

The ceramics 102 of this embodiment is a polarized piezoelectric transducer made of lead titanate zirconate [Pb(Zr, Ti)O$_3$]-based ceramics (PZT) or the like, for instance. For example, the shape of the ceramics 102, though not specifically limited, is a substantially rectangular parallelepiped shape (in other words, a flat plate shape).

To be more specific, primary electrodes 106 are formed on both surfaces which make a pair in its thickness direction, out of outer surfaces of the ceramics 102. FIG. 1 only shows one of these surfaces but the same primary electrode 106 is formed on the opposite surface (FIG. 2). The ceramics 102 further has a secondary electrode 108 at its longitudinal rear end of its outer surface. The secondary electrode 108 of this embodiment is formed only on one of the one-directional surfaces making a pair in the thickness direction (in other words, the one surface shown in FIG. 1) (FIG. 2).

The electrodes 106 and the electrode 108 are formed on the outer surfaces of the ceramics 102 by, for example, screen printing using metal paste, and their length in a width direction of the ceramics 102, that is, in a direction substantially perpendicular to the aforesaid longitudinal direction and thickness direction is slightly shorter than a width of the ceramics 102. The primary electrodes 106 have a length about a half of the whole length (longitudinal length) of the ceramics 102.

The case 104 has a case main body 104b having an opening on its bottom surface side, and also has inner walls 104a, 104a extending from the bottom surface side toward the upper surface side (in other words, toward a surface positioned on the lower side in FIG. 1) of the case 104. The case 104 has the opening only on the bottom surface side and its upper surface is closed, though not shown. Further, the inner walls 104a are slightly longer than the whole length of the ceramics 102, so that the case main body 104b can house the ceramics 102 in a vertical posture (in other words, in a state where side edge surfaces of its periphery are set vertical).

The case 104 has recessions 104c, 104d, 104e, 104f at four places in the case main body 104b. To form each of the four recessions 104c to 104f, a certain width of the inner wall 104a is scooped toward an outer side of the main body 104b (in other words, is recessed).

Among the recessions 104c to 104f, the two recessions (primary folders) 104c, 104d are disposed on the primary electrode 106 side to face each other across the ceramics 102 in the main body 104b, and the recessions 104c, 104d are formed in the same shape (in other words, are symmetric).

Further, the recessions 104c, 104d are formed at a node of the mechanical oscillation occurring in the longitudinal direction of the ceramics 102 (in other words, at a position where the amplitude of the oscillation becomes zero). To be more specific, the recessions 104c, 104d of this embodiment are positioned λ/4 apart from a longitudinal front end of the ceramics 102, λ being the whole length of the ceramics 102.

This is because the piezoelectric ceramics 102 of this embodiment is driven by a voltage with its resonance frequency (λ), and the nodes of the oscillation at this time are positioned λ/4 apart from the longitudinal front end and rear end respectively. Further, though the mechanical oscillation occurring in the longitudinal direction is small, there also occurs the mechanical oscillation in the aforesaid width direction and thickness direction. A node of the width-direction oscillation is located at a substantially center position of an upper end and a lower end of the piezoelectric ceramics 102, and a node of the thickness-direction oscillation is also located at a substantial center between its near side end and far side end.

The recessions 104e, 104f disposed on the secondary electrode 108 side also face each other across the ceramics 102. However, the recession (primary folder) 104e positioned on the near side in FIG. 1 has a larger shape than that of the recession (secondary folder) 104f positioned on the far side. Further, since the recessions 104e, 104f are provided at the longitudinal rear end of the ceramics 102, a larger output voltage can be obtained.

The case 104 has totally three terminals 110, 112, 114. The two terminals 110, 112 among them are disposed to face the primary electrodes 106 in the case 104. The other terminal 114 is disposed to face the secondary electrode 108 in the case 104. The three terminals 110, 112, 114 are inserted in the case main body 104b from the upper surface side toward the bottom surface side of the case 104, and are disposed with side surfaces thereof exposed in the recessions 104c, 104d, 104e and tips thereof projecting from the bottom surface side.

As shown in FIG. 2, in the inner walls 104a, projecting ribs 104t guiding the ceramics 102 from both sides are formed at a position λ/4 apart from the longitudinal rear end of the ceramics 102 (in other words, the node of the longitudinal mechanical oscillation), and the ceramics 102 of this embodiment is bonded to the case 104 by, for example, a silicon adhesive 124 which is filled in the main body 104b so as to cover the ribs 104t.

In the state where the ceramics 102 is thus housed in the case main body 104b, conductive blocks (primary elastic members) 116, 116 are set in the folders of the present invention, that is, in the pair of recessions 104c, 104d, respectively, and another conductive block (primary elastic member) 120 is set in the recession 104e. A block-shaped silicone rubber (secondary elastic member) 122 is set in the other recession 104f. The ceramics 102 is held in the case 104 while floated from its upper surface side and while sandwiched between the two blocks 116, 116 and further between the block 120 and the silicone rubber 122.

Each of these blocks 116, 120 is made of a conductive rubber material in a substantially rectangular parallelepiped shape and has, in addition to elasticity of silicone rubber which is a base material, conductivity of a conductive material kneaded in the silicone rubber. Consequently, the primary electrodes 106 and the secondary electrode 108 of the ceramics 102 are electrically connected to the terminals 110, 112, 114 respectively via the blocks 116, 120.

The blocks 116, 116 are disposed in the case 104 so as to be interposed between the primary electrodes 106 of the ceramics 102 and the terminals 110, 112 respectively. To be more specific, front ends of the blocks 116 are in contact with the primary electrodes 106, and their rear ends are in contact with the terminals 110 and the terminal 112 respectively. At this time, the blocks 116 are in the state of being fit in the recessions 104c, 104d corresponding thereto respectively and compressed (in other words, press-fit) between the primary electrodes 106 and the terminals 110, 112.

Figure 3:
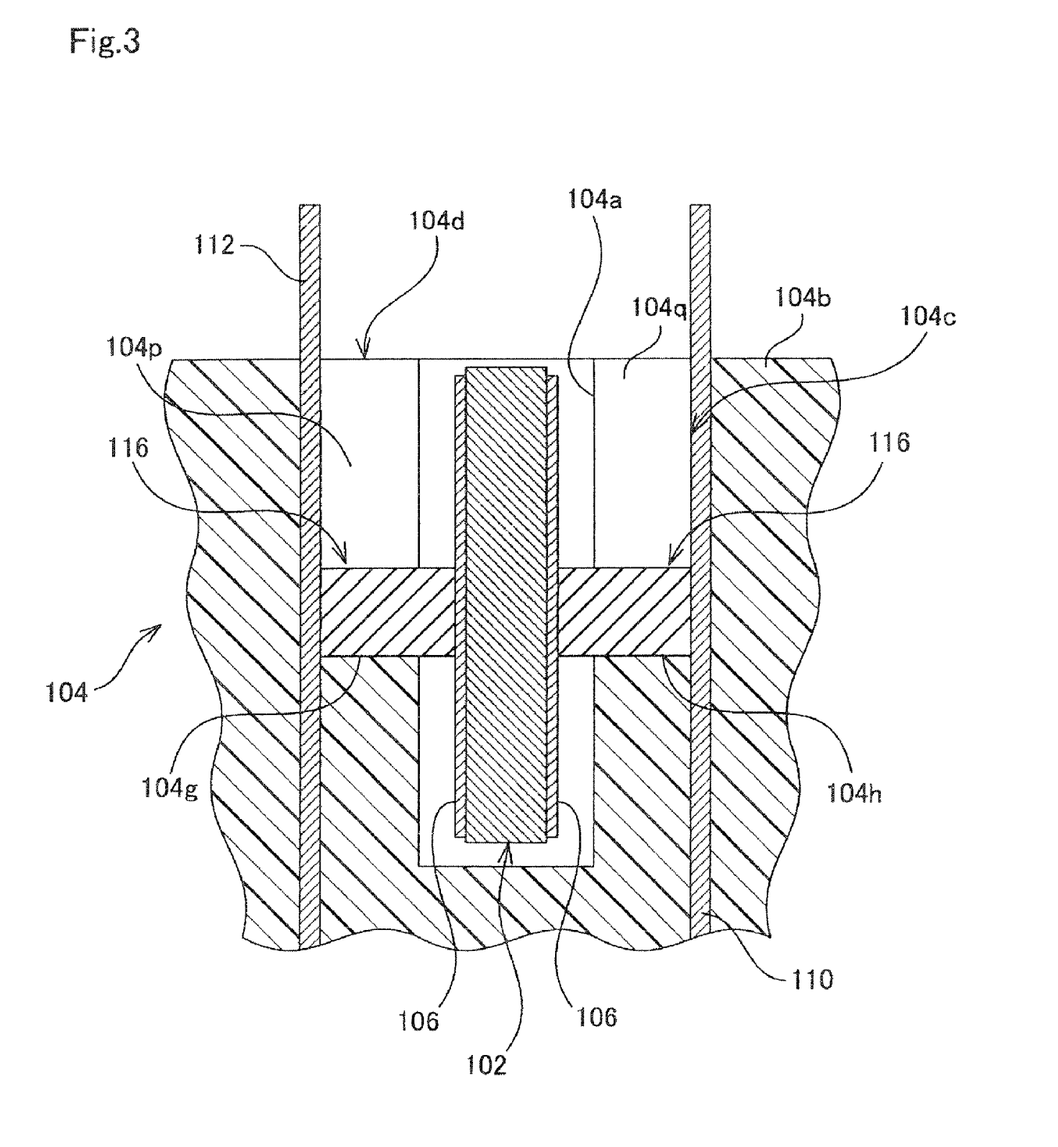
FIG. 3 is a cross-sectional view seen in the direction of the arrows III-III in FIG. 2.

More concretely, the recession 104c of this embodiment has, as shown in FIG. 3, a supporting surface (widthwise-position defining surface) 104h formed along the horizontal direction of the case 104 and supporting surfaces (longitudinal-position defining surfaces) 104q, 104q extending in the vertical direction of the case 104 from both edges of the supporting surface 104h, and the latter supporting surfaces 104q reach the bottom surface side of the case 104.

The supporting surfaces 104q, 104q facing each other restrict side surfaces extending in the vertical direction of the case 104, out of the four side surfaces of the block 116, and the supporting surface 104h restricts an upper surface extending in the horizontal direction of the case 104 (in other words, the surface positioned on the lower side in FIG. 1 and FIG. 3), out of outer surfaces of the block 116, so that the block 116 is fixedly held in the recession 104c by the totally three supporting surfaces 104h, 104q, 104q.

Further, the supporting surfaces 104q, 104q are formed in the case main body 104b so that the center of the front end of the block 116 (in other words, the end surface facing the primary electrode 106) substantially coincides with the node of the longitudinal oscillation of the ceramics 102. Further, the supporting surface 104h is formed in the main body 104b so that, for example, the center of the front end of the block 116 similarly substantially coincides with the substantially center position of the width of the primary electrode 106.

Similarly to the aforesaid recession 104c, the recession 104d of this embodiment has a supporting surface (widthwise-position defining surface) 104g formed along the horizontal direction of the case 104 and supporting surfaces (longitudinal-position defining surfaces) 104p, 104p extending in the vertical direction of the case 104 from both edges of the supporting surface 104g.

The supporting surfaces 104p, 104p restrict two side surfaces of the block 116 and the supporting surface 104g restricts an upper surface (in other words, a surface positioned on the lower side in FIG. 1 and FIG. 3) of the block 116, so that the conductive block 116 is restricted in the recession 104d by the totally three supporting surfaces 104g, 104p, 104p.

Similarly to the supporting surfaces 104q, the supporting surfaces 104p, 104p are formed in the case main body 104b so that the center of the front end of the block 116 coincides with the node of the longitudinal oscillation of the ceramics 102, and the supporting surface 104g is also formed in the main body 104b so that the center of the front end of the block 116 substantially coincides with the substantially center position of the width of the primary electrode 106.

Figure 4:
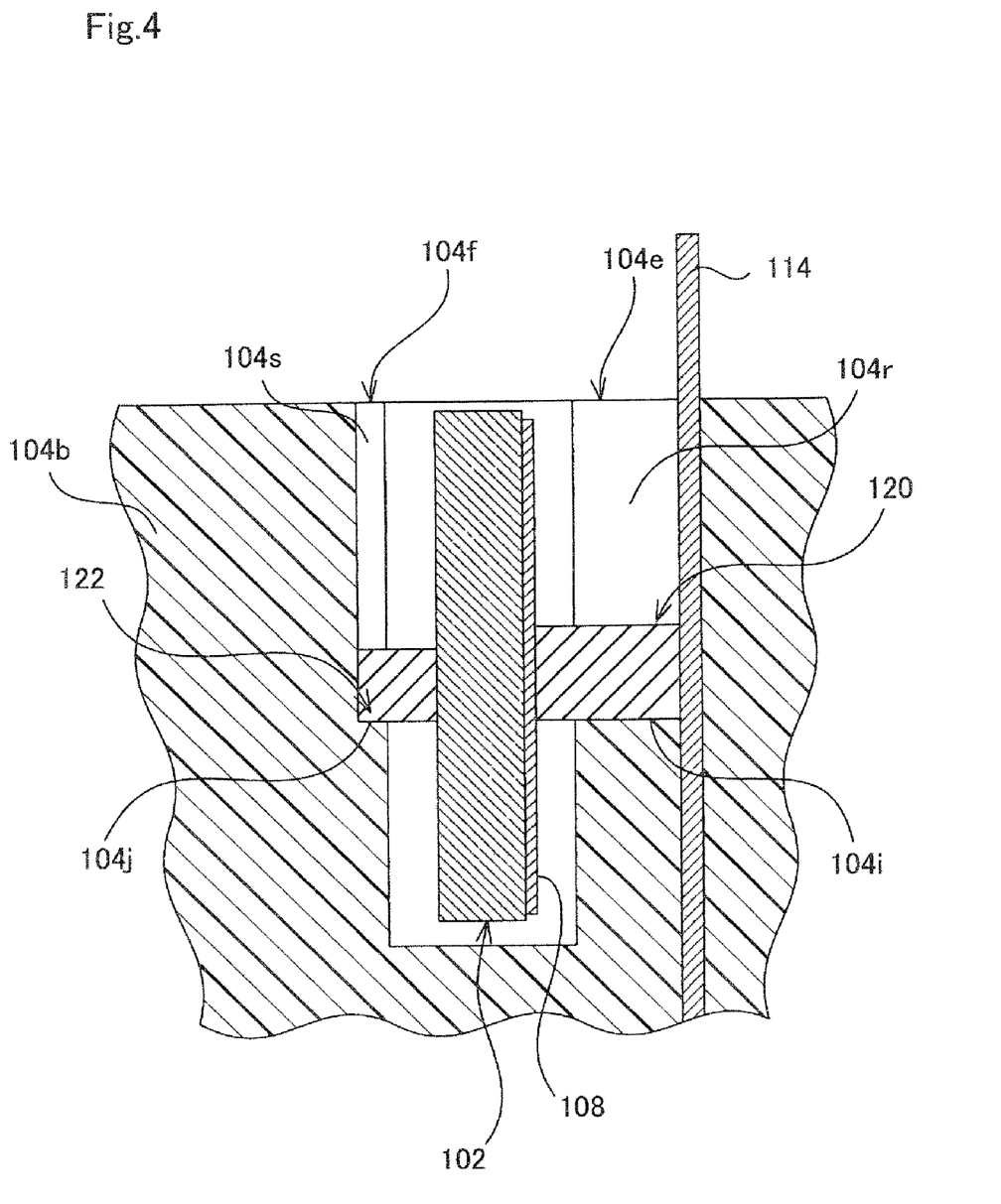
FIG. 4 is a cross-sectional view seen in the direction of the arrows IV-IV in FIG. 2.

As shown in FIG. 4, the recession 104e of this embodiment also has a supporting surface (widthwise-position defining surface) 104i formed along the horizontal direction of the case 104 and supporting surfaces 104r, 104r extending in the vertical direction of the case 104 from both edges of the supporting surface 104i respectively. The supporting surfaces 104r, 104r restrict two side surfaces of the block 120 and the supporting surface 104i restricts an upper surface (in other words, a surface positioned on the lower side in FIG. 1 and FIG. 4) of the block 120, so that the block 120 is also fixedly held in the recession 104e by the totally three supporting surfaces 104i, 104r, 104r.

Similarly to the supporting surface 104g and the supporting surface 104h, the supporting surface 104i is formed in the main body 104b so that a center of a front end of the block 120 substantially coincides with a substantially center position of the width of the secondary electrode 108.

Incidentally, since the secondary electrode 108 is formed only on the one surface of the ceramics 102 as described above, only the single block 120 corresponding thereto needs to be provided.

However, since the block 120 is compressed between the secondary electrode 108 and the terminal 114, it is preferable to provide the silicone rubber 122 also on the surface opposite the secondary electrode 108 as in this embodiment in view of the balance in the case 104. In other words, the rubber 122 and the block 120 sandwich the both surfaces of the ceramics 102 in the case 104 and the rubber 122 contributes to the absorption of the mechanical oscillation of the ceramics 102.

Therefore, the recession 104f of this embodiment also has a supporting surface (widthwise-position defining surface) 104j formed along the horizontal direction of the case 104 and supporting surfaces 104s, 104s extending in the vertical direction of the case 104 from both edges of the supporting surface 104j respectively. The supporting surfaces 104s, 104s restrict two side surfaces of the silicone rubber 122 in a substantially rectangular parallelepiped shape and the supporting surface 104j restricts an upper surface (in other words, a surface positioned on the lower side in FIG. 1 and FIG. 4) of the rubber 122.

The supporting surface 104j is also formed in the main body 104b so that a center of a front end of the silicone rubber 122 substantially coincides with the substantially center position of the width of the secondary electrode 108.

Incidentally, the aforesaid supporting surfaces 104p may have projections.

Figure 5:
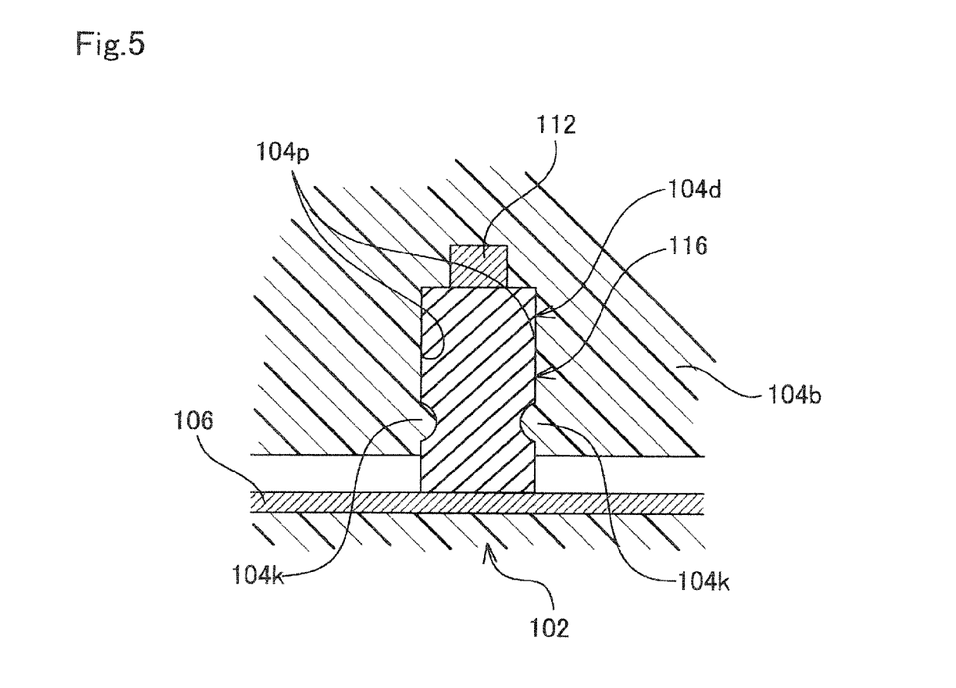
FIG. 5 is an enlarged view of an essential part of a resin case in another embodiment.

To be in more detail, in the recession 104d shown in FIG. 5, the block 116 is fixedly held between the primary electrode 106 and the terminal 112, in the same manner as in the above-described embodiment. However, projections 104k, 104k projecting toward the block 116 are formed on the supporting surfaces 104p, 104p respectively and sandwich the block 116 so as to dent the side surfaces of the block 116.

As described above, in the recession 104d of this embodiment, the block 116 is fixedly held by the two projections 104k, 104k in addition to the supporting surface 104g and the two supporting surfaces 104p. This can prevent the block 116 from coming off the recession 104d, enabling to more surely maintain the position of the block 116.

Alternatively, the side surfaces of the block 116 may be sandwiched only by projections.

Figure 6:
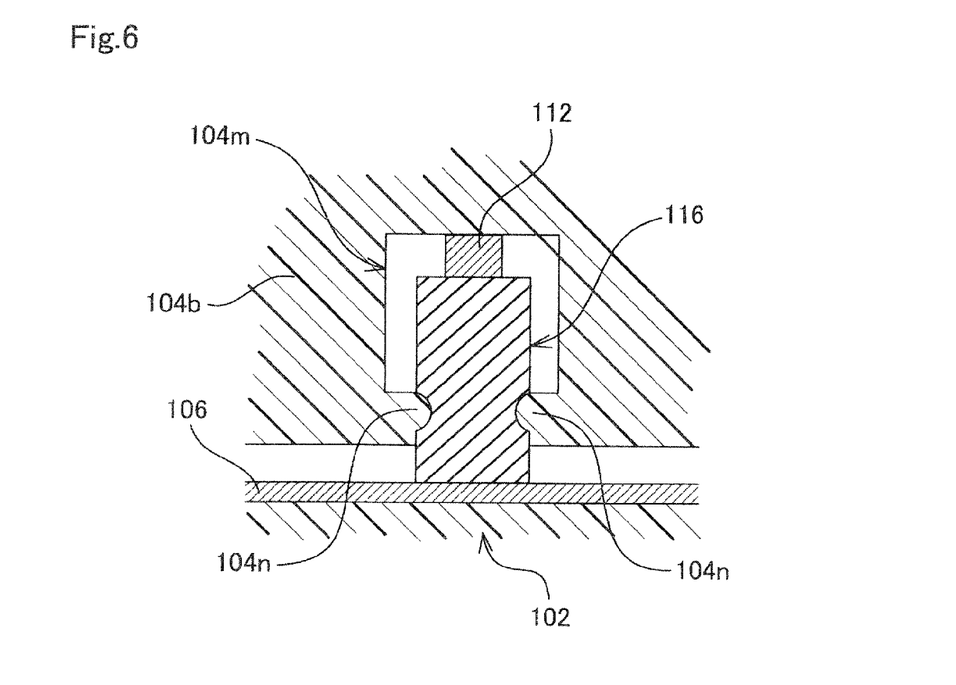
FIG. 6 is an enlarged view of an essential part of a resin case in still another embodiment.

Concretely, a recession 104m shown in FIG. 6 is a folder provided at a position corresponding to the position of the aforesaid recession 104d, and projections 104n, 104n projecting toward the block 116 are formed on its surfaces corresponding to the supporting surfaces 104p, 104p and sandwich the block 116 so as to dent the side surfaces of the block 116.

As described above, in the recession 104m of this embodiment, the block 116 is fixedly held by the supporting surface 104g and the two projections 104n, 104n.

Incidentally, the projections 104k or the projections 104n may simply sandwich the block 116 without denting the side surfaces of the block 116, and further, the projections are naturally applicable also to the aforesaid supporting surfaces 104q, 104r, 104s.

As described hitherto, according to the embodiments, the piezoelectric transformer 100 includes the piezoelectric ceramics 102 on whose outer surfaces the electrodes 106, 108 are formed, and the ceramics 102 is housed in the resin case 104. The transformer 100 further includes the terminals 110, 112, 114 disposed to face the electrodes 106, 108, and between the electrodes 106, 108 and the terminals 110, 112, 114, the conductive blocks 116, 120 are disposed. The blocks 116, 120 have conductivity and are in contact with both the electrodes 106, 108 and the terminals 110, 112, 114 to be capable of bringing the both into continuity.

Here, the transformer 100 includes the recessions 104c, 104d, 104e. The recessions 104c, 104d, 104e fixedly hold the blocks 116, 120 in the case 104, that is, hold the blocks 116, 120 in the restricted state so as to prevent their movement in the case 104, so that the blocks 116, 120 can be surely press-fit between the electrodes 106, 108 and the terminals 110, 112, 114.

Therefore, for example, even during the assembly of the transformer 100 or during the operation of the transformer 100 where the longitudinal-direction and width-direction oscillations of the ceramics 102 occur, the blocks 116, 120 do not easily displace, which makes it possible to surely maintain the positions of the blocks 116, 120 between the electrodes 106, 108 and the terminals 110, 112, 114. This as a result contributes to reliability enhancement of the transformer 100.

Further, the ceramics 102 is formed in the substantially rectangular parallelepiped shape having dimensions in its longitudinal direction, thickness direction, and width direction. Further, the electrodes 106 are formed on the surfaces which make a pair in the thickness direction, and the electrode 108 is formed on one of the surfaces which make a pair in the thickness direction. The recessions 104c, 104d, 104e have the supporting surfaces 104g, 104h, 104i, and the blocks 116, 120 are disposed on the supporting surfaces 104g, 104h, 104i so as to be positioned between the upper surface side and the bottom surface side of the case 104 in terms of the width direction.

Therefore, when the transformer 100 is assembled, it is possible to easily press-fit the blocks 116, 120 between the electrodes 106, 108 and the terminals 110, 112, 114 while preventing the displacement of the blocks 116, 120, as contrast to the conventional structure where the blocks 116, 120 are inserted up to the deepest portion of the case 104.

Further, the blocks 116, 120 are restricted by the supporting surfaces 104g, 104h, 104i so as to be positioned at the substantially center positions of the electrodes 106, 108 in terms of the width direction. Therefore, the blocks 116, 120 not only can be surely in contact with the electrodes 106, 108 but also can support the ceramics 102 at such a position as to keep the ceramics 102 in the best-balanced state, which also contributes to the prevention of the displacement of the blocks 116, 120.

Furthermore, on the primary electrode 106 side, the recessions 104c, 104d also have the supporting surfaces 104p, 104q, and the blocks 116, 116 are restricted by the supporting surfaces 104p, 104q so as to be positioned near the node of the longitudinal oscillation of the ceramics 102. Therefore, the blocks 116, 116 are not easily influenced by the longitudinal oscillation.

The transformer 100 further includes the silicone rubber 122 and the recession 104f. The silicone rubber 122 is not conductive and is disposed to face the aforesaid block 120 across the ceramics 102 and is in contact with both the case 104 and the ceramics 102. The recession 104f fixedly holds the silicone rubber 122 in the case 104, so that the rubber 122 can be surely press-fit between the case 104 and the ceramics 102. This also prevents the easy displacement of the silicon rubber 122.

The recession 104f also has the supporting surface 104j, and the silicone rubber 122 is restricted by the supporting surface 104j so as to be positioned between the upper surface side and the bottom surface side of the case 104 in terms of the aforesaid width direction. Therefore, also in this case, it is possible to easily press-fit the silicone rubber 122 between the case 104 and the ceramics 102 while preventing the displacement of the silicone rubber 122, as contrast to the conventional structure.

Furthermore, the silicon rubber 122 is also restricted by the supporting surface 104j so as to be positioned at the substantially center position of the ceramics 102 in terms of the aforesaid width direction. Therefore, the silicone rubber 122 not only can be surely in contact with the ceramics 102 but also can support the ceramics 102 at such a position as to keep the ceramics 102 in the best-balanced state, which also contributes to the prevention of the displacement of the silicone rubber 122.

Further, the recessions 104c, 104d, 104e, 104f, 104m have the projections 104k, 104n projecting toward the blocks 116, 120 and the rubber 122, and the projections 104k, 104n sandwich the both side surfaces of the blocks 116, 120 and the rubber 122, so that the blocks 116, 120 and the rubber 122 are prevented from coming off the recessions 104c, 104d, 104e, 104f, 104m and the positions of the blocks 116, 120 and the rubber 122 can be further surely maintained.

The present invention is not limited to the embodiments described above and various modifications can be made therein without departing from the scope of the claims. For example, the structures of the above-described embodiments can be partly omitted or may be arbitrarily combined in different manners form the above manner.

Further, in the embodiments described above, the supporting surfaces 104g, 104h, 104i are disposed at the substantially center positions of the electrodes 106, 108 in terms of the aforesaid width direction, but this form is not restrictive. That is, the supporting surfaces 104g, 104h, 104i may be disposed near the node of the oscillation in terms of the aforesaid width direction, and in this case, since they are disposed at a position where the widthwise oscillation of the ceramics 102 is small, the influence of the oscillation is not easily given.

Further, the nodes of the longitudinal oscillation of the ceramics 102 exist on straight lines along the width direction, in other words, along the direction from the upper surface side to the bottom surface side of the case 104. In view of this, the position where the blocks 116 are disposed may be the node of the longitudinal oscillation, provided that the supporting surfaces 104g, 104h are formed between the upper surface side and the bottom surface side, and is not limited to the aforesaid substantially center position of the electrodes 106 or the aforesaid position near the node of the width-direction oscillation.

Further, the blocks 116, 120 are not limited to those in the above-described embodiments, and for example, each of the primary blocks 116 may have a conductive member as an intermediate layer and have elastic holding layers on both sides in terms of the longitudinal direction of the ceramics 102.

Further, each of the blocks 116 and the secondary block 120 may have a conductive rubber layer and a silicone rubber layer which are stacked in the width direction of the ceramics 102 (zebra structure).

Still further, these blocks 116, 120 may be made of different conductive materials.

Further, the electrodes 106 of the embodiments are formed on the surfaces which make a pair in the thickness direction of the ceramics 102. However, also adoptable is a structure in which, similarly to the electrode 108, the electrode 106 is formed only on one of the surfaces which make a pair in the thickness direction, and by the aforesaid conductive block being disposed only on the side facing the surface having this electrode 106 and the aforesaid silicone rubber being disposed on the side facing the surface without any electrode, the ceramics 102 is sandwiched by these block and rubber.

Further, needless to say, the piezoelectric transformer of the present invention is applicable to high voltage power supplies not only of the aforesaid inverters for liquid crystal display back-lighting but also of dust collectors, copy machines, facsimile machines, ionizers, ozonizers, and the like.

In any of these cases, as in the aforesaid case, the present invention provides the effect of surely maintaining the position of the conductive block connected between the electrode and the terminal.

What is claimed is:

1. A piezoelectric transformer comprising:
   a piezoelectric transducer on whose outer surface an electrode is formed;
   a case housing said piezoelectric transducer;
   a terminal disposed to face said electrode;
   a first elastic member which is in contact with both said electrode and said terminal in said case and which has conductivity to electrically connect said electrode to said terminal and
   a first recess which is formed in an inner wall of said case, which is exposed to outside from a bottom surface side of said case, and which fixedly holds said elastic member to press-fit said elastic member between said electrode and said terminal.

2. The piezoelectric transformer according to claim 1, wherein:
   said piezoelectric transducer has a substantially rectangular parallelepiped shape, and said electrode is formed on at least one surface out of surfaces which make a pair in a thickness direction of said piezoelectric transducer; and
   said first recess has a widthwise-position defining surface on which said elastic member is disposed, wherein the widthwise-position defining surface defines a position of the elastic member between an upper surface side and the bottom surface side of said case, in terms of a width direction substantially perpendicular to a longitudinal direction and the thickness direction of said piezoelectric transducer.

3. The piezoelectric transformer according to claim 2, wherein said widthwise-position defining surface is set so as to position said elastic member near a node of oscillation in terms of the width direction of said piezoelectric transducer.

4. The piezoelectric transformer according to claim 3, wherein:
   an electrode is formed on each surface of said piezoelectric transducer among the surfaces which make the pair in the thickness direction of said piezoelectric transducer; and
   said first recess further has a longitudinal-position defining surface which is set so as to position said elastic member near a node of oscillation in terms of the longitudinal direction of said piezoelectric transducer.

5. The piezoelectric transformer according to claim 4, wherein said first recess further has projections projecting from longitudinal-position defining surfaces thereof toward said elastic member to sandwich the elastic member.

6. The piezoelectric transformer according to claim 3, wherein said first recess further has projections projecting from longitudinal-position defining surfaces thereof toward said elastic member to sandwich the elastic member.

7. The piezoelectric transducer according to claim 2, wherein said widthwise-position defining surface is set so as to position said elastic member at a substantially center position of said electrode in terms of the width direction of said piezoelectric transducer.

8. The piezoelectric transformer according to claim 7, wherein:
an electrode is formed on each surface of said piezoelectric transducer among the surfaces which make the pair in the thickness direction of said piezoelectric transducer; and
said first recess further has a longitudinal-position defining surface which is set so as to position said elastic member near a node of oscillation in terms of the longitudinal direction of said piezoelectric transducer.

9. The piezoelectric transformer according to claim 8, wherein said first recess further has projections projecting from longitudinal-position defining surfaces thereof toward said elastic member to sandwich the elastic member.

10. The piezoelectric transformer according to claim 7, wherein said first recess further has projections projecting from longitudinal-position defining surfaces thereof toward said elastic member to sandwich the elastic member.

11. The piezoelectric transformer according to claim 2, wherein:
an electrode is formed on each surface of said piezoelectric transducer among the surfaces which make the pair in the thickness direction of said piezoelectric transducer; and
said first recess further has a longitudinal-position defining surface which is set so as to position said elastic member near a node of oscillation in terms of the longitudinal direction of said piezoelectric transducer.

12. The piezoelectric transformer according to claim 11, wherein said first recess further has projections projecting from longitudinal-position defining surfaces thereof toward said elastic member to sandwich the elastic member.

13. The piezoelectric transformer according to claim 2, wherein said first recess further has projections projecting from longitudinal-position defining surfaces thereof toward said elastic member to sandwich the elastic member.

14. The piezoelectric transformer according to claim 2, further comprising:
a nonconductive second elastic member which is disposed to face said first elastic member across said piezoelectric transducer and which is in contact with both said case and said piezoelectric transducer in said case; and
a second recess which is formed in an inner wall of said case, which is exposed to outside from the bottom surface side of said case, and which fixedly holds said second elastic member to press-fit the second elastic member between said case and said piezoelectric transducer.

15. The piezoelectric transformer according to claim 14, wherein said second recess has a widthwise-position defining surface which is set so as to position said second elastic member between the upper surface side and the bottom surface side of said case, in terms of the width direction of said piezoelectric transducer.

16. The piezoelectric transformer according to claim 15, wherein said widthwise-position defining surface of the second recess is set so as to position said second elastic member at a substantially center position of said piezoelectric transducer in terms of the width direction of said piezoelectric transducer.

17. The piezoelectric transformer according to claim 14, wherein said second recess has projections projecting from longitudinal-position defining surfaces thereof toward said second elastic member to sandwich the second elastic member.

18. The piezoelectric transformer according to claim 1, wherein:
said piezoelectric transducer has a substantially rectangular parallelepiped shape, and an electrode is formed on each surface of said piezoelectric transducer among plural surfaces which make a pair in a thickness direction of said piezoelectric transducer; and
said first recess has a longitudinal-position defining surface which is set so as to position said elastic member near a node of oscillation in terms of a longitudinal direction of said piezoelectric transducer.

19. The piezoelectric transformer according to claim 18, wherein said first recess further has projections projecting from longitudinal-position defining surfaces thereof toward said elastic member to sandwich the elastic member.

20. The piezoelectric transformer according to claim 1, wherein said first recess has projections projecting from longitudinal-position defining surfaces thereof toward said elastic member to sandwich the elastic member.

* * * * *